United States Patent
Hosokawa

(10) Patent No.: US 8,952,339 B2
(45) Date of Patent: Feb. 10, 2015

(54) CHROMATIC ABERRATION CORRECTOR AND METHOD OF CONTROLLING SAME

(71) Applicant: JEOL Ltd., Tokyo (JP)

(72) Inventor: Fumio Hosokawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 57 days.

(21) Appl. No.: 13/771,403

(22) Filed: Feb. 20, 2013

(65) Prior Publication Data

US 2014/0054468 A1 Feb. 27, 2014

(30) Foreign Application Priority Data

Feb. 24, 2012 (JP) ................................. 2012-038287

(51) Int. Cl.
H01J 37/02 (2006.01)
H01J 37/153 (2006.01)
H01J 37/26 (2006.01)

(52) U.S. Cl.
CPC ............... *H01J 37/02* (2013.01); *H01J 37/153* (2013.01); *H01J 37/26* (2013.01); *H01J 2237/1534* (2013.01)
USPC ......................... 250/396 R; 250/397; 250/398

(58) Field of Classification Search
CPC .......... H01J 37/02; H01J 37/26; H01J 37/153
USPC ...................................................... 250/396 R
See application file for complete search history.

(56) References Cited

U.S. PATENT DOCUMENTS

| | | | |
|---|---|---|---|
| 6,555,818 B1* | 4/2003 | Hosokawa | 250/311 |
| 2004/0036030 A1* | 2/2004 | Matsuya et al. | 250/396 R |
| 2006/0219935 A1* | 10/2006 | Henstra | 250/396 ML |
| 2008/0093563 A1* | 4/2008 | Sawada et al. | 250/396 R |
| 2008/0283749 A1* | 11/2008 | Muller et al. | 250/311 |
| 2009/0032709 A1* | 2/2009 | Sawada | 250/311 |
| 2009/0230317 A1* | 9/2009 | Hirayama et al. | 250/396 R |
| 2009/0242786 A1* | 10/2009 | Yoshida et al. | 250/396 R |
| 2010/0084567 A1* | 4/2010 | Sawada et al. | 250/396 ML |
| 2010/0230584 A1* | 9/2010 | Niebel et al. | 250/252.1 |
| 2011/0114852 A1* | 5/2011 | Henstra | 250/396 R |
| 2011/0284758 A1* | 11/2011 | Sawada | 250/396 ML |

OTHER PUBLICATIONS

PTO translation of Katsumi Ura reference, 1994 p. 118-128.*
P.W. Hawkes, "Quadrupoles in Electron Lens Design", Advances in Electronics and Electron Physics, Supplement 7, Academic Press, 1970, p. 90, New York and London.
Katsumi Ura, "Electron and Ion Beam Optics (in Japanese)", Kyoritsu Publishing Company, 1994, pp. 118-128, first ed., chapter "Quadrupole Lenses".

* cited by examiner

*Primary Examiner* — Phillip A Johnston
*Assistant Examiner* — Sean Luck
(74) *Attorney, Agent, or Firm* — The Webb Law Firm

(57) ABSTRACT

A chromatic aberration corrector and method of controlling this chromatic aberration corrector is offered. The corrector has first and second multipole lenses for producing quadrupole fields and first and second transfer lenses each having a focal length of f. The first and second multipole lenses are arranged on opposite sides of the first and second transfer lenses. The distance between the first multipole lens and the first transfer lens is f. The distance between the first transfer lens and the second transfer lens is 2f. The distance between the second transfer lens and the second multipole lens is f−Δ. The corrector is so designed that the relationship, f>Δ>0, holds.

3 Claims, 2 Drawing Sheets

CHROMATIC ABERRATION CORRECTOR AND METHOD OF CONTROLLING SAME

BACKGROUND OF THE INVENTION

1. Field of the Invention

The present invention relates to a chromatic aberration corrector for correcting the electron optical system of an electron microscope for chromatic aberration and also to a method of controlling the chromatic aberration corrector.

2. Description of Related Art

In the past, a method using multipole lenses for producing quadrupole fields to correct the electron optical system (such as an objective lens) of an electron microscope for chromatic aberration has been known. The characteristics of quadrupole fields have been already investigated in detail, and the orbit of electrons through a quadrupole field and aberrations in the field have been clarified (see P. W. Haukes, Quadrupoles in Electron Lens Design (Advance in Electronics & Electron Physics, Supplement 7), Academic Press (1970), New York and London). With a view to eliminating chromatic and spherical aberrations in a magnetic field used in an electron microscope, combinations of plural quadrupole fields have been studied. As a result, the following conclusion concerning the number of combined quadrupole fields has been derived: In an aberration corrector using quadrupole fields, the focal plane in the x-orbit and the focal plane in the y-orbit must be the same and the magnification in the x-direction must be identical with the magnification in the y-direction, i.e., the so-called stigmatic conditions must hold. Any combination of two quadrupole fields cannot satisfy these conditions (see, for example, P. W. Haukes, Quadrupoles in Electron Lens Design (Advance in Electronics & Electron Physics, Supplement 7), Academic Press (1970), New York and London, p. 90). With two stages of quadrupole fields, it is possible to bring the focal plane of the x-orbit and the focal plane of the y-orbit into coincidence. However, it is substantially impossible to make the magnifications in the x- and y-directions the same. This is referred to as pseudo-stigmatic conditions (see, for example, Katsumi Ura, "Electron and Ion Beam Optics (in Japanese)", Kyoritsu Publishing Company (1994), first ed., chapter "Quadrupole Lenses"). Therefore, regarding aberration correctors using quadrupoles, combinations of four or more stages of quadrupoles that satisfy the stigmatic conditions have been studied and commercialized.

In the conventional chromatic aberration correction using four stages of quadrupoles, correction in the x-direction and correction in the y-direction are performed using different stages of quadrupole fields because the characteristics of a quadrupole field are directly employed for chromatic aberration correction. That is, in the x- and y-orbits, if convergence is achieved in one of the orbits, divergence occurs in the other. If the correction plane is different between the x- and y-directions, it is impossible to bring their correction planes simultaneously into coincidence with the objective lens plane in which chromatic aberration is introduced. Where the chromatic aberration correction plane and introduction plane are not coincident, collateral aberrations proportional to the distance between them are produced.

SUMMARY OF THE INVENTION

In view of the foregoing problem, the present invention has been made. According to some aspects of the invention, it is possible to offer a chromatic aberration corrector which is simple in structure but is capable of accurately correcting the electron optical system of an electron microscope for chromatic aberration. Also, a method of controlling this chromatic aberration corrector is offered.

The present invention provides a chromatic aberration corrector for correcting an electron optical system of an electron microscope for chromatic aberration, the corrector having first and second multipole lenses producing quadrupole fields and first and second transfer lenses each having a focal length of f. The first and second multipole lenses are arranged on opposite sides of the first and second transfer lenses. The distance between the first multipole lens and the first transfer lens is $f-\Delta_1$. The distance between the first and second transfer lenses is $2f$. The distance between the second transfer lens and the second multipole lens is $f-\Delta_2$. The corrector is so designed that the relationship, $f > \Delta_1 + \Delta_2 > 0$, holds.

In the chromatic aberration corrector of this construction, stigmatic conditions can be satisfied even using two-stages of quadrupoles by placing the first and second transfer lenses between the first and second multipole lenses each consisting of a quadrupole. Furthermore, in this chromatic aberration corrector, correction planes in the x-direction and the y-direction, respectively, can be simultaneously brought into coincidence with the chromatic aberration introduction plane of the electron optical system. That is, the present invention makes it possible to perform chromatic aberration correction with a simpler structure and greater accuracy than where four stages of quadrupoles are used.

In one feature of this chromatic aberration corrector, the sum, $\Delta = \Delta_1 + \Delta_2$, is given by $$\Delta = Z\left(\frac{2\sin(\beta)\sinh(\beta)}{\beta(\cos(\beta)\sinh(\beta) + \sin(\beta)\cosh(\beta))} - 1\right) \quad (A)$$

$$\beta = \sqrt{C}\,Z \quad (B)$$

where Z is the length of the first and second multipole lenses taken along the optical axis and C is the intensity of the excitation of the first and second multipole lenses.

The present invention also provides a chromatic aberration corrector for correcting an electron optical system of an electron microscope for chromatic aberration, the corrector having first and second multipole lenses for producing quadrupole fields, first and second transfer lenses each having a focal length of f, and an auxiliary lens. The first and second multipole lenses are arranged on opposite sides of the first and second transfer lenses. The first and second transfer lenses are arranged on opposite sides of the auxiliary lens. The distance between the first multipole lens and the first transfer lens is f. The distance between the first transfer lens and the auxiliary lens is f. The distance between the auxiliary lens and the second transfer lens is f. The distance between the second transfer lens and the second multipole lens is $f-\Delta_s$. This chromatic aberration corrector is so designed that the relationship, $f > \Delta_s > 0$, holds.

In this chromatic aberration corrector according to the present invention, the first and second transfer lenses and the auxiliary lens are disposed between the first and second multipole lenses each consisting of a quadrupole. The stigmatic conditions can be satisfied even using two stages of quadrupoles. Furthermore, the correction planes in the x- and y-directions, respectively, can be simultaneously brought into coincidence with the chromatic aberration introduction plane of the electron optical system. That is, with this chromatic aberration corrector, chromatic aberration correction can be performed with a simpler structure and greater accuracy than where four stages of quadrupoles are used. In addition, the stigmatic conditions can be satisfied by a simple control operation consisting of controlling the intensity of the excitation of the auxiliary lens.

In one feature of this chromatic aberration corrector, said $\Delta_s$ is given by $$\Delta_s > Z\left(\frac{2\sin(\beta)\sinh(\beta)}{\beta(\cos(\beta)\sinh(\beta) + \sin(\beta)\cosh(\beta))} - 1\right) \quad (C)$$

$$\beta = \sqrt{C} Z \quad (D)$$

where Z is the length of the first and second multipole lenses taken along the optical axis and C is the intensity of the excitation of the first and second multipole lenses.

In addition, the present invention provides a method of controlling a chromatic aberration corrector that corrects an electron optical system of an electron microscope for chromatic aberration. The chromatic aberration corrector has first and second multipole lenses for producing quadrupole fields, first and second transfer lenses each having a focal length of f, and an auxiliary lens. The first and second multipole lenses are arranged on opposite sides of the first and second transfer lenses. The first and second transfer lenses are arranged on opposite sides of the auxiliary lens. The distance between the first multipole lens and the first transfer lens is f. The distance between the first transfer lens and the auxiliary lens is f. The distance between the auxiliary lens and the second transfer lens is f. The distance between the second transfer lens and the second multipole lens is f–$\Delta_s$. The first and second multipole lenses have a length of Z as taken along the optical axis. The first and second multipole lenses have an excitation intensity of C. This method consists of varying the focal length $f_A$ of the auxiliary lens by controlling the excitation intensity of the auxiliary lens such that the following conditions are satisfied:

$$\Delta_s - \frac{f^2}{f_A} = Z\left(\frac{2\sin(\beta)\sinh(\beta)}{\beta(\cos(\beta)\sinh(\beta) + \sin(\beta)\cosh(\beta))} - 1\right) \quad (E)$$

$$\beta = \sqrt{C} Z \quad (F)$$

According to the present invention, stigmatic conditions can be satisfied using two stages of quadrupoles by placing first and second transfer lenses between first and second multipole lenses each being a quadrupole. Furthermore, according to the invention, the correction planes in the x- and y-directions can be simultaneously brought into coincidence with the chromatic aberration introduction plane of the electron optical system. That is, in accordance with the present invention, chromatic aberration correction can be performed with a simpler structure and higher accuracy than where four stages of quadrupoles are used. Furthermore, in accordance with the invention, stigmatic conditions can be satisfied by performing a simple control operation consisting of controlling the intensity of excitation of the auxiliary lens.

DESCRIPTION OF THE PREFERRED EMBODIMENTS

The preferred embodiments of the present invention are hereinafter described in detail with reference to the drawings. It is to be understood that the embodiments provided below do not unduly restrict the scope of the present invention delineated by the appended claims and that not all the configurations described below are essential constituent components of the invention.

First Embodiment

Figure 1:
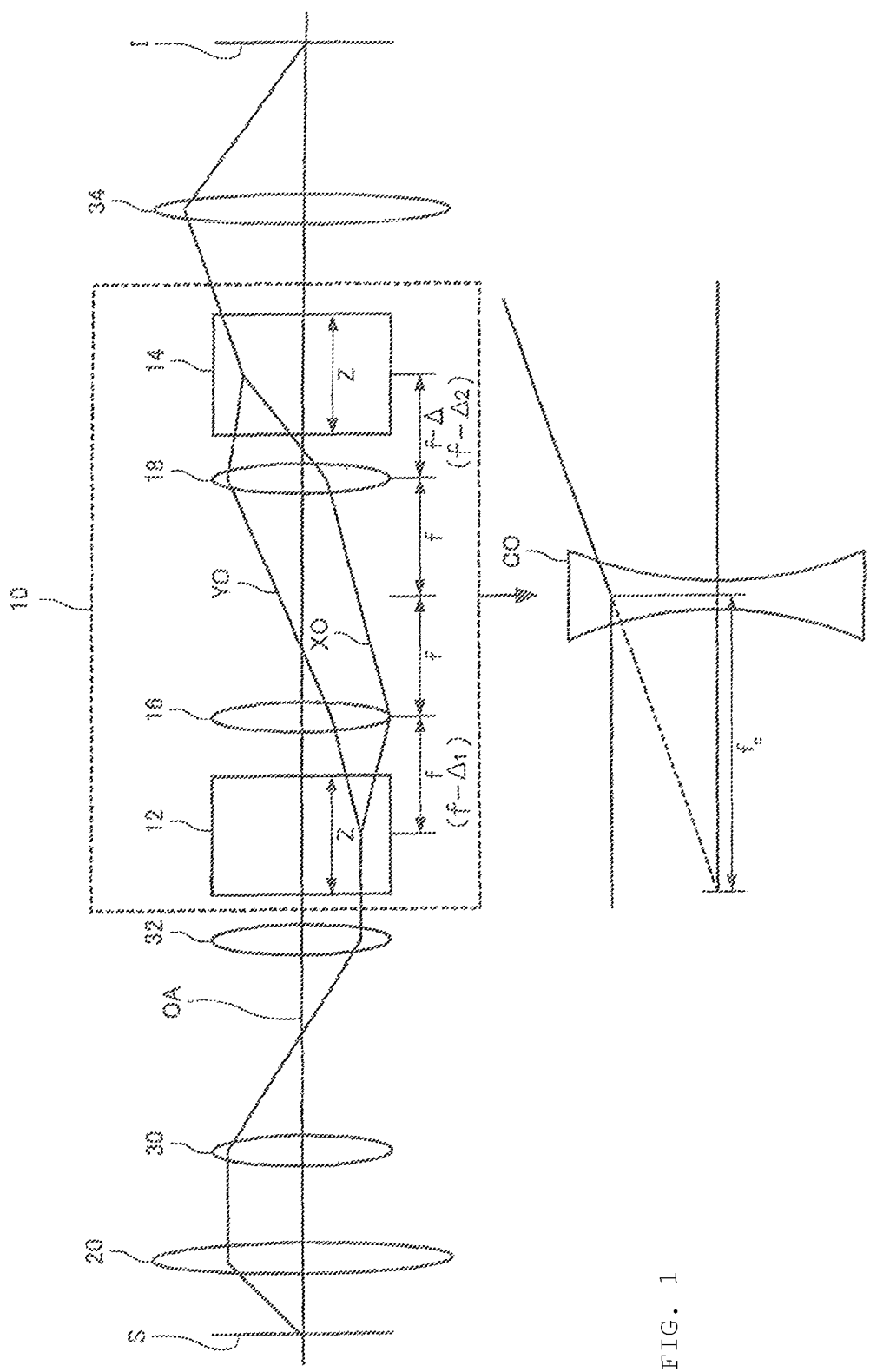
FIG. 1 is a ray diagram of a chromatic aberration corrector associated with a first embodiment of the present invention, showing the configuration of the corrector.

One example of the configuration of a chromatic aberration corrector associated with a first embodiment of the present invention is shown in FIG. 1. In this example, the chromatic aberration corrector of the present embodiment is applied to the imaging system of a transmission electron microscope.

The chromatic aberration corrector 10 shown in FIG. 1 includes first and second multipole lenses 12, 14 for producing quadrupole fields and first and second transfer lenses 16, 18 and corrects chromatic aberration in an objective lens 20 of the transmission electron microscope by a concave lens effect created by these lenses. The first multipole lens 12 and the second multipole lens 14 are positioned on opposite sides of the first transfer lens 16 and second transfer lens 18.

Equivalent electric and magnetic fields are applied to the first multipole lens 12 and second multipole lens 14 which are opposite in polarity. That is, electrons undergoing a diverging force from the first multipole lens 12 undergo a converging force from the second multipole lens 14. Electrons undergoing a converging force from the first multipole lens 12 undergo a diverging force from the second multipole lens 14. Each of the first multipole lens 12 and second multipole lens 14 has a length of Z along the optical axis.

The lenses constituting the chromatic aberration corrector 10 are so arranged that the distance between the first multipole lens 12 and the first transfer lens 16 is f, the distance between the first transfer lens 16 and the second transfer lens 18 is 2f, and the distance between the second transfer lens 18 and the second multipole lens 14 is f–$\Delta$. f is the focal length of the first transfer lens 16 and the second transfer lens 18. A assumes a value in the range given by f>$\Delta$>0, and is adjusted to satisfy the stigmatic conditions described later. Alternatively, assuming that the distance between the first multipole lens 12 and the first transfer lens 16 is f–$\Delta_1$ and that the distance between the second transfer lens 18 and the second multipole lens 14 is f–$\Delta_2$, the relationship, $\Delta_1+\Delta_2=\Delta$, is satisfied.

Electrons which emanate from the axis on a sample S and which will be focused leave the objective lens 20 in a parallel relation to the optical axis OA such that the focal point is formed at an infinitely remote point by the objective lens 20. The electrons exiting from the objective lens 20 are once focused onto the optical axis OA by lenses 30 and 32 and then impinge on the first multipole lens 12 of the chromatic aberration corrector 10 in a parallel relation to the lens 12. The divergent orbit at the first multipole lens 12 is referred to as the x-orbit XO. The convergent orbit is referred to as the y-orbit YO.

Let $r_h$ and $r_h'$ be the exit position of the x-orbit and its tilt, respectively, at the first multipole lens 12. Let $r_s$ and $r_s'$ be the exit position of the y-orbit and its tilt, respectively, at the first multipole lens 12. Using matrices $M_h$ and $M_s$, these positions and tilts are given by $$\begin{pmatrix} r_h \\ r'_h \end{pmatrix} = M_h \begin{pmatrix} r_{xo} \\ r'_{xo} \end{pmatrix} \quad (1)$$

$$\begin{pmatrix} r_s \\ r'_s \end{pmatrix} = M_s \begin{pmatrix} r_{yo} \\ r'_{yo} \end{pmatrix} \quad (2)$$

$$M_h = \begin{pmatrix} \cosh(\beta) & \frac{1}{\alpha}\sinh(\beta) \\ \alpha\sinh(\beta) & \cosh(\beta) \end{pmatrix} \quad (3)$$

$$M_s = \begin{pmatrix} \cos(\beta) & \frac{1}{\alpha}\sin(\beta) \\ -\alpha\sin(\beta) & \cos(\beta) \end{pmatrix} \quad (4)$$

$$\alpha = \sqrt{C} \quad (5)$$

$$\beta = \sqrt{C} Z \quad (6)$$

where $r_{x0}$ and $r_{x0}'$ are the incident position of the x-orbit and its tilt, respectively, in the first multipole lens 12, $r_{y0}$ and $r_{y0}'$ are the incident position of the y-orbit and its tilt, respectively, in the first multipole lens 12, and C is a value indicating the intensity of the excitation of the first multipole lens 12 and is given by $$C = \frac{V}{Ub^2}\left(\frac{2\gamma U + 1}{\gamma U + 1}\right) + \sqrt{\frac{e}{2mU(\gamma U + 1)}}\frac{2\mu_0 Ni}{b^2} \quad (7)$$

$$\gamma = \frac{e}{2mc_v^2} \quad (8)$$

where V is an excitation voltage for producing a quadrupole field, U is the accelerating voltage of the electron microscope, b is the bore radius of the multipole element, e is the elementary electric charge, m is the mass of an electron, $\mu_0$ is the free space permeability, Ni is the number of ampere turn of the excitation for the quadrupole field, and $c_v$ is the light velocity. Each of the first multipole lens 12 and the second multipole lens 14 produces a quadrupole field in which electric and magnetic fields are superimposed. The quadrupole fields each generated by superimposition of electric and magnetic fields are so formed that forces given to each electron cancel out each other. The force imparted to each electron is given by Eq. (7). The forces produced by the electric and magnetic fields cancel out each other. This means that the potential V in Eq. (7) is different in sign from the ampere-turn Ni. Under these circumstances, the force given to the electron by the electric quadrupole field is made to slightly overcome the force given to the electron by the magnetic quadrupole field. In this way, in the quadrupole fields used in the chromatic aberration corrector 10, the electric and magnetic fields are made to compete with each other such that the electric field is slightly greater in intensity than the magnetic field. As a result, the electric and magnetic fields together act as a quadrupole field.

The electrons emerging from the first multipole lens 12 and forming an image are transferred by the first and second transfer lenses 16 and 18 and then made to impinge on the second multipole lens 14. The first transfer lens 16 and the second transfer lens 18 have the same focal length of f. The first transfer lens 16 is at a distance of f from the operating plane (center plane) of the first multipole lens 12. The first transfer lens 16 and the second transfer lens 18 are at a distance of 2f from each other. The operating plane (center plane) of the second transfer lens 18 and the operating plane (center plane) of the second multipole lens 14 are spaced apart by a distance of f–Δ. Because of this lens arrangement, the transferring actions of the first transfer lens 16 and the second transfer lens 18 are given as follows, using a matrix $M_t$:

$$M_t = \begin{pmatrix} 1 & L \\ 0 & 1 \end{pmatrix} \quad (9)$$

$$L = -(Z + \Delta) < 0 \quad (10)$$

Since the second multipole lens 14 and the first multipole lens 12 are opposite in polarity, the exit position $r_{hs}$ of the x-orbit in the second multipole lens 14 and its tilt $r_{hs}'$, the exit position $r_{sh}$ of the y-orbit in the second multipole lens 14 and its tilt $r_{sh}'$ are given as follows, using the matrix $M_h$ of Eq. (3), the matrix $M_s$ of Eq. (4), and the matrix $M_t$ of Eq. (9):

$$\begin{pmatrix} r_{hs} \\ r'_{hs} \end{pmatrix} = M_s M_t M_h \begin{pmatrix} r_{x0} \\ r'_{x0} \end{pmatrix} \quad (11)$$

$$\begin{pmatrix} r_{sh} \\ r'_{sh} \end{pmatrix} = M_h M_t M_h \begin{pmatrix} r_{y0} \\ r'_{y0} \end{pmatrix} \quad (12)$$

The stigmatic conditions that are important in a chromatic aberration corrector using a combination of plural quadrupole fields hold if the position and tilt of the x-orbit become equal to the position and tilt of the y-orbit at the exit plane of the chromatic aberration corrector on which an electron beam with rotational symmetry impinges. Accordingly, in order for the chromatic aberration corrector 10 of the present embodiment satisfy the stigmatic conditions, the following relationship needs to be met:

$$\begin{pmatrix} r_{hs} \\ r'_{hs} \end{pmatrix} = \begin{pmatrix} r_{sh} \\ r'_{sh} \end{pmatrix} \quad (13)$$

Because the incident position $r_{x0}$ of the x-orbit and its tilt $r_{x0}'$ are equal to the incident position $r_{y0}$ of the y-orbit and its tilt $r_{y0}'$, respectively, the following equation needs to hold:

$$M_s M_t M_h = M_h M_t M_s \quad (14)$$

In particular, using Eqs. (3)-(6) and (9), Δ that satisfies the following equation is found:

$$\Delta = Z\left(\frac{2\sin(\beta)\sinh(\beta)}{\beta(\cos(\beta)\sinh(\beta) + \sin(\beta)\cosh(\beta))} - 1\right) \quad (15)$$

The arrangement of the lenses is adjusted according to the found Δ such that the stigmatic conditions hold in the chromatic aberration corrector 10. Under this condition, an electron beam with rotational symmetry enters the chromatic aberration corrector 10 and exits from the corrector 10 while the rotational symmetry is maintained.

Since the chromatic aberration corrector 10 acts as a concave lens CO, a virtual plane of the concave lens CO is formed at the position of the focal length $f_c$. Diverging electrons leaving from the second multipole lens 14 forms an image I through a lens 34. Then, a magnified image is formed by the electron optical system of normal design of the transmission electron microscope. The chromatic aberration correcting function of the chromatic aberration corrector 10 is next described in detail.

Since the objective lens 20 is set to perform imaging at an infinitely remote point, it is assumed that $r_{x0}'=0$ and $r_{y0}'=0$. Because the stigmatic conditions hold, the focal length $f_c$ is determined from the following equations using Eqs. (12) and (13):

$$\frac{1}{f_c} = \frac{r_{hs}'}{r_{x0}} = \frac{r_{sh}'}{r_{y0}} \qquad (16)$$

$$\frac{1}{f_c} = \sqrt{C}\left(\frac{\sinh^2(\beta) - \sin^2(\beta)}{\cos(\beta)\sinh(\beta) + \sin(\beta)\cosh(\beta)}\right) \qquad (17)$$

It is now assumed that the focal length $f_c$ has a positive sign in a direction reverse to the direction of motion of electrons. As can be seen by computation of the right side of Eq. (17), the focal length $f_c$ assumes a positive value at all times within a range given by $0<\beta<0.7\pi$. It is urged that the intensity of each quadrupole field be so set that $\beta<$ approximately $0.5\pi$ at maximum, for the following reason. At a quadrupole field intensity where $\beta$ is close to $0.8\pi$, converging electrons start to vibrate across the optical axis as can be seen from Eqs. (2)-(5). Diverging electrons are so bent that they collide against the wall of the electron passage. Accordingly, it may be reasonably considered that the focal length $f_c$ defined by Eq. (17) assumes a positive value in a practical range.

FIG. 1 shows the orbit of electrons when the focal length $f_c$ is positive. The electrons are deflected away from the optical axis OA by passing through the chromatic aberration corrector 10. Because the right side of Eq. (17) contains none of $r_{x0}$ and $r_{y0}$, all the electrons exiting from the axis of the sample S form a virtual image at a position at the focal length $f_c$ from the virtual principal plane of the corrector 10 in a direction opposite to the direction of motion of the electrons. That is, the concave lens CO having a focal length of $f_c$ is formed by the chromatic aberration corrector 10. It can be considered that its principal plane is the intersection plane of an orbit incident on the first multipole lens 12 and an orbit exiting from the second multipole lens 14. Satisfying the stigmatic conditions ensures that the same virtual principal plane is obtained from the x- and y-orbits.

That is, it can be considered that electrons incident on the chromatic aberration corrector 10 are deflected away from the optical axis OA for both x-orbit and y-orbit and that they are deflected at the principal plane of one concave lens CO. The principal plane of the concave lens CO is roughly the center of the first multipole lens 12 and is also roughly the center of the second multipole lens 14. It can be said that the center of the first multipole lens 12 and the center of the second multipole lens 14 are nearly optically equivalent planes (at the same plane within the range of the first-order orbit) by the action of the first and second transfer lenses 16, 18.

Assuming that the objective lens 20 has a focal length of $f_o$, the magnification M of image at a point at which a virtual image is formed is given by $$M = \frac{|f_c|}{f_o} \qquad (18)$$

Chromatic aberration in the objective lens 20 of the electron microscope is caused by the fact that the focal length of the objective lens 20 varies by $\delta f$ due to a quite small energy variation $\delta U$ of electrons. Assuming that the objective lens 20 has a chromatic aberration coefficient of Cc, the focal length variation $\delta f$ is given by $$\delta f = Cc \frac{1}{U}\left(\frac{2\gamma U + 1}{\gamma U + 1}\right)\delta U \qquad (19)$$

The focal length variation $\delta f$ is a focus deviation produced by a decrease in the deflecting force of the objective lens 20 caused by an increase in the electron energy provided that the energy variation $\delta U$ has a positive value. The objective lens 20 is a convex lens. The focal length variation $\delta f$ produces a deviation in the direction of motion of electrons for electrons which have larger energies and thus are less deflected. $\delta f$ in Eq. (19) is a focal deviation in the sample surface. At an arbitrary image plane, a deviation of the image in the z-direction (along the optical axis) corresponding to the focal length variation $\delta f$ is an amount obtained by multiplying the focal length variation $\delta f$ by the square of the magnification of the image. Consequently, the chromatic aberration in the objective lens 20 causes the focal length $f_c$ shown in FIG. 1 to deviate an amount equal to $M^2 \delta f$ to the right (in the direction of motion of electrons) in the plane of the paper of FIG. 1.

In contrast, the chromatic aberration corrector 10 acts as the concave lens CO and so the deviation of the focal length $f_c$ for electrons which have greater energies and thus are less deflected is in a direction opposite to the direction of motion of electrons. Accordingly, chromatic aberration is corrected provided that the deviation of the focal length $f_c$ caused by the chromatic aberration in the objective lens 20 and the deviation of the focal length $f_c$ caused by the chromatic aberration corrector 10 just cancel out each other. This condition is given by $$\frac{df_c}{dU}\delta U = M^2 Cc \frac{1}{U}\left(\frac{2\gamma U + 1}{\gamma U + 1}\right)\delta U \qquad (20)$$

Using Eq. (18), Eq. (20) is varied to $$\frac{1}{f_c^2}\frac{df_c}{dU} = \frac{1}{f_o^2} Cc \frac{1}{U}\left(\frac{2\gamma U + 1}{\gamma U + 1}\right)\delta U \qquad (21)$$

That is, chromatic aberration in the objective lens 20 is corrected by the chromatic aberration corrector 10 by giving the potential V and ampere-turn Ni of the quadrupole field as given in Eq. (7) to the first and second multipole lenses 12 and 14 so as to satisfy Eq. (21). There are infinite numbers of combinations of V and Ni satisfying Eq. (21). A set of V (in V) and Ni (in A) used to correct chromatic aberration occurring under the conditions where the accelerating voltage U is 200 kV, the focal length $f_o$ of the objective lens 20 is 2.3 mm, and the chromatic aberration coefficient Cc is 1.5 mm is shown in Table 1, as well as the resulting parameters Δ (in mm), $f_c$ (in mm), and M. It is assumed that the first and second multipole lenses 12 and 14 have a bore radius (b) of 2.5 mm and a length Z of 80 mm along the optical axis.

TABLE 1

| V (V) | Ni (A) | Δ (mm) | $f_c$ (mm) | M = |fc|/$f_o$ |
|---|---|---|---|---|
| 7,000 | −25.14 | 13.46 | 29.64 | 12.89 |
| 8,000 | −29.09 | 10.88 | 37.06 | 16.11 |
| 9,000 | −33.02 | 9.002 | 45.18 | 19.64 |
| 10,000 | −36.94 | 7.499 | 54.61 | 23.75 |

In this way, in the chromatic aberration corrector 10 of the present embodiment, stigmatic conditions can be satisfied although two stages of quadrupole fields are used. The chromatic aberration correction employing the two stages of quadrupole fields and two stages of transfer lenses in the chromatic aberration corrector 10 does not directly use the characteristics of the quadrupole fields but makes use of the secondary concave lens action produced by variations in the electron orbit within the quadrupole fields. This concave lens action acts simultaneously on electrons in a converging orbit and on electrons in a diverging orbit. That is, with a single stage of quadrupole field, the chromatic aberration correcting function possessed by a concave lens can be made to act on electrons in x- and y-orbits at the same time. In consequence, the correction planes in the x- and y-directions, respectively, can be simultaneously brought into coincidence with the chromatic aberration introduction plane of the objective lens. Chromatic aberration correction can be performed accurately without producing any collateral aberrations.

Second Embodiment

Figure 2:
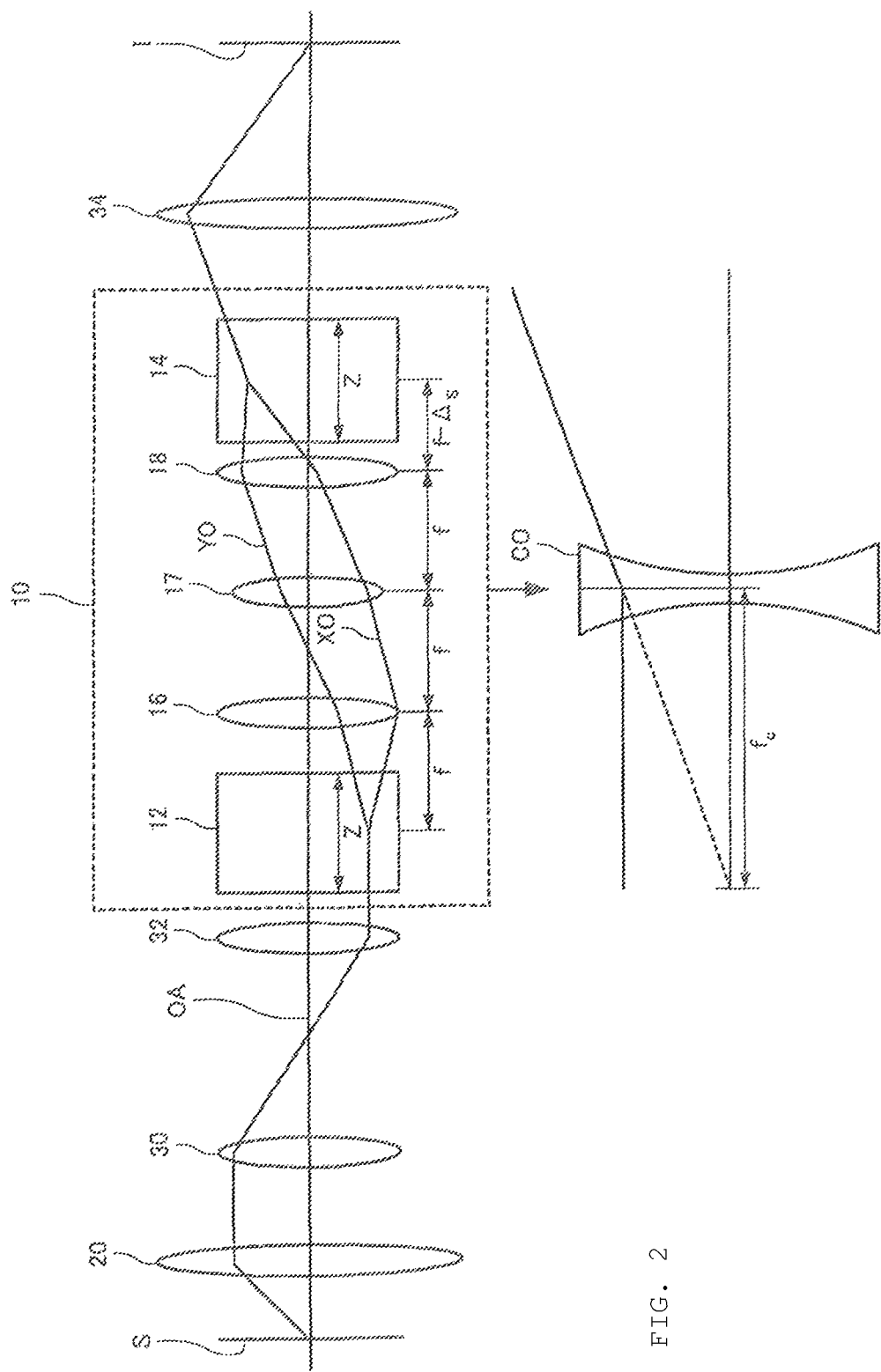
FIG. 2 is a ray diagram of a chromatic aberration corrector associated with a second embodiment of the invention, showing the configuration of the corrector.

One example of the configuration of a chromatic aberration corrector associated with a second embodiment of the present invention is shown in FIG. 2. In both FIGS. 1 and 2, like components are indicated by like reference numerals and those components which have been already described will not be described below.

In the chromatic aberration corrector 10 shown in FIG. 1, it is necessary that $\Delta$ satisfying Eq. (15) be found and that the second multipole lens 14 be mechanically fixed according to the found $\Delta$. This gives less latitude in designing the chromatic aberration corrector. Accordingly, as shown in FIG. 2, adjustments for satisfying the stigmatic conditions may be performed by placing an auxiliary lens 17 between the first transfer lens 16 and the second transfer lens 18 and controlling the intensity of the excitation of the auxiliary lens 17 so as to adjust the focal length of the auxiliary lens 17 that performs an auxiliary action.

In the chromatic aberration corrector 10 shown in FIG. 2, the operation plane of the first multipole lens 12 and the first transfer lens 16 are spaced apart from each other by a distance of f, i.e., the focal length of the first and second transfer lenses. The first transfer lens 16 and the auxiliary lens 17 are spaced apart from each other by a distance of f. The auxiliary lens 17 and the second transfer lens 18 are spaced apart from each other by a distance of f. The operation plane of the second transfer lens 18 and the operation plane of the second multipole lens 14 are spaced apart from each other by a distance of $f-\Delta_s$. $\Delta_s$ is a value in a range represented by $f>\Delta_s>0$, and is given by $$\Delta_s > Z\left(\frac{2\sin(\beta)\sinh(\beta)}{\beta(\cos(\beta)\sinh(\beta) + \sin(\beta)\cosh(\beta))} - 1\right) \quad (22)$$

That is, the value $\Delta_s$ is set greater than $\Delta$ that satisfies the stigmatic conditions of Eq. (15), and the arrangement of the lenses is adjusted according to the set value $\Delta_s$. The intensities of the lenses other than the auxiliary lens 17 are the same as in the case of FIG. 1. The relationship between $\Delta$ and $\Delta_s$ is given by $$\Delta = \Delta_s - \frac{f^2}{f_A} \quad (23)$$

where $f_A$ is the focal length of the auxiliary lens 17. Eq. (23) means that the focal length $f_A$ decreases with increasing the intensity of excitation of the auxiliary lens 17. This results in an equivalent effect to that obtained when $\Delta$ of FIG. 1 is reduced. As given in Eq. (22), $\Delta_s$ has been previously set greater than $\Delta$ that satisfies the stigmatic conditions. Therefore, the intensity of the excitation of the auxiliary lens 17 (i.e., the focal length $f_A$) should be adjusted such that $\Delta$ obtained from Eq. (23) satisfies the stigmatic conditions given by Eq. (15) (i.e., the right side of Eq. (23) becomes equal to the right side of Eq. (22)). That is, adjustments for satisfying the stigmatic conditions can be made by controlling the excitation intensity of the auxiliary lens 17. This allows more latitude in adjusting the apparatus. The chromatic aberration correcting function of the chromatic aberration corrector 10 shown in FIG. 2 is exactly the same as the function illustrated in FIG. 1.

It is to be understood that the present invention is not restricted to the above-described embodiments and that various changes and modifications are possible. The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

For example, in the above-described first and second embodiments, a chromatic aberration corrector is used in the imaging system of a transmission electron microscope. A chromatic aberration corrector associated with the present invention may be used in the illumination system of a transmission electron microscope. In this case, the optical elements of the chromatic aberration corrector 10 shown in FIGS. 1 and 2 are arranged in mirror symmetry with respect to sample S on the electron beam source side. The excitation intensities of the optical elements of the chromatic aberration corrector 10 are exactly the same as in the examples of FIGS. 1 and 2.

Having thus described my invention with the detail and particularity required by the Patent Laws, what is desired protected by Letters Patent is set forth in the following claims.

The invention claimed is:
1. A chromatic aberration corrector for correcting an electron optical system of an electron microscope for chromatic aberration, said chromatic aberration corrector comprising:
  first and second multipole lenses for producing quadrupole fields;
  and first and second transfer lenses each having a focal length of f,
    wherein said first and second multipole lenses are arranged on opposite sides of said first and second transfer lenses;

wherein the distance between the first multipole lens and the first transfer lens is f−$\Delta_1$, the distance between the first and second transfer lenses is 2f, and the distance between the second transfer lens and the second multipole lens is f−$\Delta_2$;

and wherein the corrector is so designed that the relationship, f>$\Delta_1$+$\Delta_2$>0, holds;

wherein the sum, $\Delta$=$\Delta_1$+$\Delta_2$, is given by $$\Delta = Z\left(\frac{2\sin(\beta)\sinh(\beta)}{\beta(\cos(\beta)\sinh(\beta) + \sin(\beta)\cosh(\beta))} - 1\right) \quad (A)$$

$$\beta = \sqrt{C}\, Z \quad (B)$$

where Z is the length of the first and second multipole lenses taken along an optical axis and C is the excitation intensity of the first and second multipole lenses.

2. A chromatic aberration corrector for correcting an electron optical system of an electron microscope for chromatic aberration, said chromatic aberration corrector comprising:

first and second multipole lenses for producing quadrupole fields;

first and second transfer lenses each having a focal length of f, and an auxiliary lens on opposite sides of which are arranged the first and second transfer lenses;

wherein said first and second multipole lenses are arranged on opposite sides of said first and second transfer lenses;

wherein the distance between the first multipole lens and the first transfer lens is f, the distance between the first transfer lens and the auxiliary lens is f, the distance between the auxiliary lens and the second transfer lens is f and the distance between the second transfer lens and the second multipole lens is f−$\Delta_s$;

and wherein the corrector is so designed that the relationship, f>$\Delta_s$>0, holds;

wherein said $\Delta_s$ is given by $$\Delta_s > Z\left(\frac{2\sin(\beta)\sinh(\beta)}{\beta(\cos(\beta)\sinh(\beta) + \sin(\beta)\cosh(\beta))} - 1\right) \quad (C)$$

$$\beta = \sqrt{C}\, Z \quad (D)$$

where Z is the length of the first and second multipole lenses taken along an optical axis and C is the excitation intensity of the first and second multipole lenses.

3. A method of controlling a chromatic aberration corrector that corrects an electron optical system of an electron microscope for chromatic aberration, said chromatic aberration corrector having first and second multipole lenses for producing quadrupole fields, first and second transfer lenses each having a focal length of f and an auxiliary lens, the first and second multipole lenses being arranged on opposite sides of the first and second transfer lenses, the first and second transfer lenses being arranged on opposite sides of the auxiliary lens, the first multipole lens, the second multipole lens, the first transfer lens, the second transfer lens, and the auxiliary lens being so arranged that the distance between the first multipole lens and the first transfer lens is f, the distance between the first transfer lens and the auxiliary lens is f, the distance between the auxiliary lens and the second transfer lens is f and the distance between the second transfer lens and the second multipole lens is f−$\Delta_s$, said method comprising the step of:

controlling the excitation intensity of the auxiliary lens to vary the focal length $f_A$ of the auxiliary lens so as to satisfy conditions given by $$\Delta_s - \frac{f^2}{f_A} = Z\left(\frac{2\sin(\beta)\sinh(\beta)}{\beta(\cos(\beta)\sinh(\beta) + \sin(\beta)\cosh(\beta))} - 1\right) \quad (E)$$

$$\beta = \sqrt{C}\, Z \quad (F)$$

where Z is the length of the first and second multipole lenses taken along an optical axis and C is the excitation intensity of the first and second multipole lenses.

* * * * *

UNITED STATES PATENT AND TRADEMARK OFFICE
CERTIFICATE OF CORRECTION

| | | |
|---|---|---|
| PATENT NO. | : 8,952,339 B2 | Page 1 of 1 |
| APPLICATION NO. | : 13/771403 | |
| DATED | : February 10, 2015 | |
| INVENTOR(S) | : Fumio Hosokawa | |

It is certified that error appears in the above-identified patent and that said Letters Patent is hereby corrected as shown below:

In the Claims

Column 12, Line 18, Claim 3, delete "off" and insert -- of f, --

Signed and Sealed this
Second Day of June, 2015

Michelle K. Lee
*Director of the United States Patent and Trademark Office*